United States Patent [19]

Nishikawa et al.

[11] Patent Number: 5,278,580
[45] Date of Patent: Jan. 11, 1994

[54] THERMAL HEAD

[75] Inventors: Mineo Nishikawa; Hiroshi Hayashi, both of Kyoto, Japan

[73] Assignee: Rohm Co., Ltd., Kyoto, Japan

[21] Appl. No.: 818,920

[22] Filed: Jan. 10, 1992

[30] Foreign Application Priority Data

Feb. 6, 1991 [JP] Japan .................. 3-038046

[51] Int. Cl.⁵ ............................................. B41J 2/335
[52] U.S. Cl. ................................................ 346/76 PH
[58] Field of Search ................... 346/76 PH; 361/216

[56] References Cited

FOREIGN PATENT DOCUMENTS

| | | |
|---|---|---|
| 0157563 | 10/1985 | European Pat. Off. . |
| 0235827 | 9/1987 | European Pat. Off. . |
| 0359328 | 3/1990 | European Pat. Off. . |
| 0368514 | 5/1990 | European Pat. Off. . |
| 3433779 | 3/1986 | Fed. Rep. of Germany . |
| 0044737 | 3/1980 | Japan ......................... 361/414 |
| 59-228743 | 12/1984 | Japan . |
| 64-78859 | 3/1989 | Japan . |

*Primary Examiner*—Benjamin R. Fuller
*Assistant Examiner*—Huan Tran
*Attorney, Agent, or Firm*—William H. Eilberg

[57] ABSTRACT

A thermal head comprises a head circuit board having a surface carrying a heating resistor line and at least one drive element for heating the resistor line. The drive element is enclosed in a resinous package. At least a surface portion of the resinous package is electrostatically conductive but electrically non-conductive to work as antistat. The antistatic surface portion or entirety of the resinous package may be made of electrically non-conductive matrix resin which contains a predetermined percentage of electrically conductive substance.

7 Claims, 4 Drawing Sheets

THERMAL HEAD

BACKGROUND OF THE INVENTION

1. Field of the Invention

This invention relates generally to thermal heads which are widely used in facsimile machines, word processors and so forth. More specifically, the invention relates to a thermal head of the type which comprises a head circuit board carrying a heating resistor line divisionally actuated by at least on drive IC.

2. Description of the Prior Art

In general, a thermal head comprises an elongate head circuit board which carries a heating resistor line extending along one longitudinal edge of the circuit board. The circuit board also carries an array of drive IC's for divisionally actuating the resistor line to provide a line of multiple heating dots, and a printed conductor pattern which makes a sophisticated circuit arrangement on the circuit board.

In such a thermal head, because the drive IC's are relatively sensitive to shocks and mechanical forces, it is proposed to protect the drive IC array by a metallic cover member, as disclosed for example in Japanese Utility Model Application Laid-open No. 57-121543 (Laid-open: Jul. 28, 1982). Obviously, the cover member prevents the drive IC array from coming into contact with an external objects.

Further, the Japanese utility model document also proposes that the metallic cover member is grounded. During operation of the thermal head for printing, an ink ribbon and/or paper (including thermosensitive paper) may be electrostatically charged due to inevitable sliding movement thereof relative to the heating resistor and/or the platen, and the electrostatic charge of the ribbon and/or paper induces opposite electrostatic charge on the cover member. If this happens, the grounded cover member allows electrostatic charge to escape from the cover member, thereby preventing the drive IC's from being electrostatically disturbed or damaged.

However, the thermal head disclosed in the above Japanese utility model document is disadvantageous in that the metallic cover member increases the size and weight of the thermal head.

For realization of size and weight reduction, it has been recently proposed to enclose the array of drive IC's and their respective wires in a resinous package which is made of a relatively hard resin such as epoxy resin, unsaturated polyester resin or polyetheramide resin. The use of the resinous package makes it unnecessary to use any protective cover member.

However, the use of the resinous package is defective in that it cannot eliminate the problem of electrostatic influences, as opposed to the metallic cover member disclosed in the Japanese utility model document. Specifically, when the package is made of epoxy resin, unsaturated polyester resin or polyetheramide resin, the volume resistivity of the package is approximately from $10^{13}$ to $10^{14}$ ($\Omega \cdot cm$) or even higher. Due to such a high volume resistivity or high electrical insulation, the resinous package is easily charged electrostatically at a high voltage with a small electrostatic capacity. As a result, the drive IC's becomes liable to malfunction, and the heating resistor may be damaged by discharging upon passage of the oppositely charged ink ribbon or paper.

SUMMARY OF THE INVENTION

It is, therefore, an object of the present invention to provide a thermal head which, while being capable of realizing reduction in size and weight, prevents electrostatic disturbances and/or damages by effectively removing electrostatic charging.

According to the present invention, there is provided a thermal head comprising a head circuit board having a surface carrying a heating resistor means and at least one drive element for heating the resistor means, said at least one drive element being enclosed in a resinous package, wherein at least a surface portion of the resinous package is electrostatically conductive but electrically non-conductive to work as antistat.

Other objects, features and advantages of the present invention will be fully understood from the following detailed description given with reference to the accompanying drawings.

DETAILED DESCRIPTION

Figure 1:
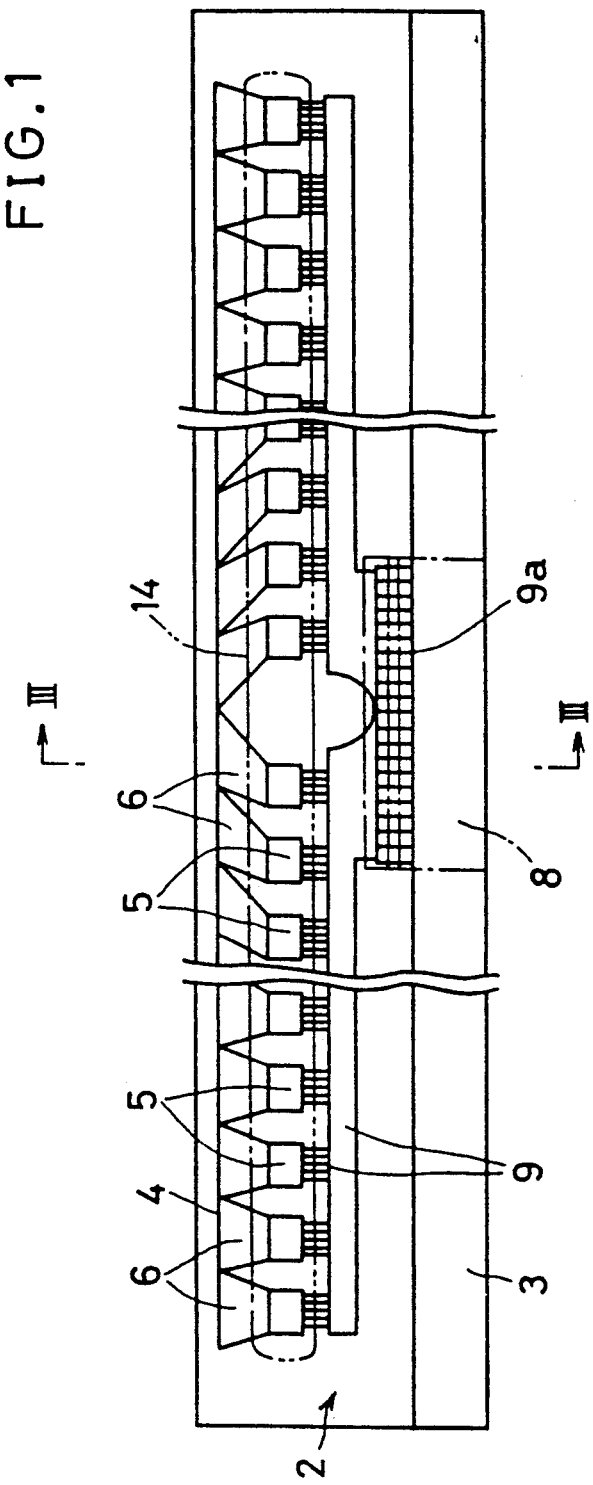
FIG. 1 is a plan view schematically showing a thermal head according to a first embodiment of the present invention.
Figure 2:
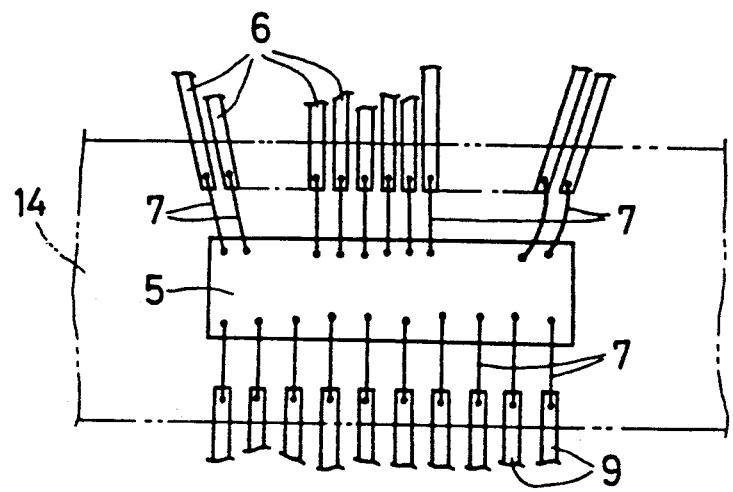
FIG. 2 is an enlarged fragmentary plan view showing a circuit arrangement near a drive IC incorporated in the thermal head of FIG. 1.
Figure 3:
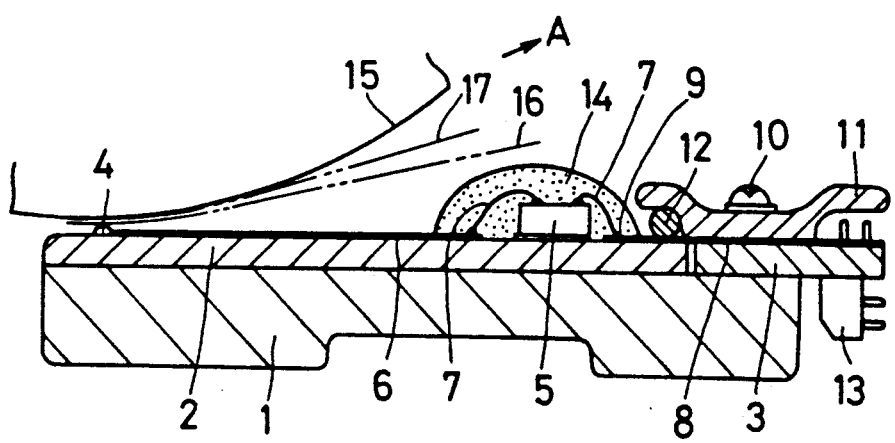
FIG. 3 is an enlarged sectional view taken along lines III—III in FIG. 1.

Referring first to FIGS. 1 to 3 of the accompanying drawings, there is illustrated a thermal head according to a first embodiment of the present invention. The thermal head mainly comprises a metallic support plate 1 (see FIG. 3) made for example of aluminum to serve also as a heat sink, an elongate head circuit board 2 made of an insulating material such as ceramic, and a flexible connector board 8 reinforced by a backing 3. The head circuit board 2 and the backing 3 (with the flexible connector board 8) are fixed to the support plate 1.

The head circuit board 2 has a surface which carries a heating resistor line 4 extending along one longitudinal edge of the board. The surface of the head circuit board also carries an array of drive IC's 5 for divisionally actuating the resistor line 4, thereby providing a line of heating dots. The surface of the head circuit board further carries a printed conductor pattern which includes individual electrodes 6 (see FIG. 2) connected to the resistor line 4, a wiring conductor pattern 9, and other conductors (not shown).

As shown in FIGS. 2 and 3, the individual electrodes 6 and the wiring conductor pattern 9 are connected to the respective drive IC's 5 through wires 7. Thus, selected spots or dots of the resistor line 4 are heated by supplying electric power through selected ones of the individual electrodes 6. The wiring conductor pattern 9 has a connection terminal portion 9a arranged centrally adjacent to a longitudinal edge of the head circuit board 2 which is located opposite to the resistor line 4.

The flexible connector board 8 projects beyond the backing 3. The underside of the connector board 8 is formed with a printed conductor pattern (not shown) in corresponding relation to the connection terminal portion 9a of the head circuit board 2, and the connector board is overlapped partially on the head circuit board 2 at the connection terminal portion 9a thereof. The backing 3 may be made for example of a glass-fiber-reinforced epoxy resin.

In assembly, the flexible connector board 8 together with the backing 3 is fixed to the support plate 1 by means of bolts 10 (only one shown in FIG. 3) screwed in the support plate 1 through a presser member 11, the connector board 8 and the backing 3. Further, the flexible connector board 8 is held in intimate contact with the head circuit board 2 by a elastic rod 12 arranged between the pressure member 11 and the connector board 8. Thus, the connector board 8 (namely, the unillustrated conductor pattern thereof) is electrically connected to the head circuit board 2 (namely, the wiring pattern 9). Further, the underside of the backing 3 carries a connector (or connectors) 13 for connection to external circuitry through a flexible cable (not shown) for example.

According to the present invention, the array of drive IC's 5 is enclosed in an antistatic resinous package 14. Specifically, according the embodiment of FIGS. 1-3, the package 14 is entirely made of a synthetic resin which is electrostatically conductive but electrically non-conductive. Preferably, the package 14 should additionally enclose the wires 7 connecting the respective drive IC's 5 to the individual electrodes 6 and the wiring pattern 9.

The antistatic resinous package 14 may be formed for example by the following procedure. First, electrically non-conductive matrix resin (e.g. polyetheramide resin or epoxy resin) in paste form is mixed with electrically conductive substance (e.g. about 20 wt. % of carbon) and kneaded. Then, the mixture paste is applied to the head circuit board 2 to completely enclose the drive IC array 5 and the wires 7. Finally, the applied paste is allowed to harden.

When polyetheramide resin or epoxy resin is used as the matrix resin for mixture with about 20 wt. % of carbon as the conductive substance, the resulting resinous package 14 will have a volume resistivity of about $10^5$ ($\Omega$·cm). The volume resistivity will further decrease as the carbon content increases.

In general, the resinous package 14 is considered to be electrostatically conductive but electrically non-conductive when the volume resistivity thereof is within a range of $10^4$-$10^{10}$ ($\Omega$·cm), preferably $10^5$-$10^9$ ($\Omega$·cm). Thus, the resinous package 14 formed as above can work effectively as antistat.

In addition to carbon, examples of electrically conductive substances for mixture with the non-conductive matrix resin include silver powder, copper powder, various surfactants, and so forth. Examples of applicable surfactants include anionic surfactants (such as alkyl sulfonate type, alkyl aryl sulfonate type, alkylamine sulfonate type), cationic surfactants (such as quaternary ammonium salt type, quaternary ammonium resin type, pyridinium salt type), non-ionic surfactants (such as ether type, amine or amide type, etanolamide type), and ampho-ionic surfactants (such as betaine type).

In operation, a platen 15 (see FIG. 3) is disposed in opposition to the resistor line 4 of the head circuit board 2, and paper 17 and a thermosensitive ink ribbon 16 are passed between the platen 15 and the resistor line 4 in the direction of an arrow A in FIG. 3. The respective drive IC's 5 are actuated in response to externally supplied signals to heat selected spots or dots of the resistor line 4, thereby performing intended printing onto the paper 17.

During the operation, the ink ribbon 16 and/or the paper 17 generate static electricity due to friction relative to each other and/or the platen 15. However, the antistatic resinous package 14, which is electrostatically conductive, continuously allows the generated static electricity to escape along its surface. Thus, it is possible to effectively prevent the drive IC's 5 and the resistor line 4 from being electrostatically disturbed or damaged.

Figure 4:
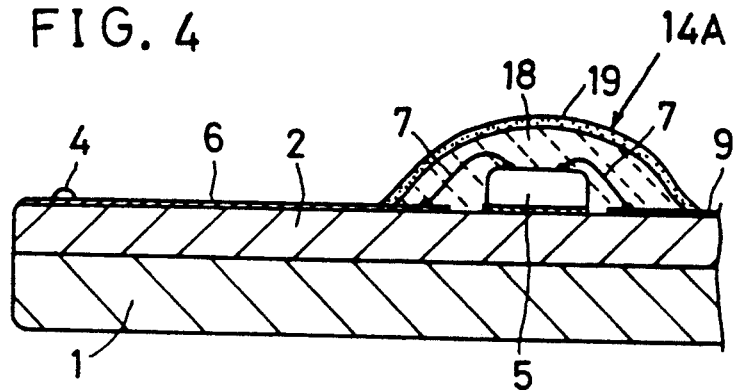
FIG. 4 is a fragmentary transverse sectional view showing a thermal head according to a second embodiment of the present invention.

FIG. 4 shows a thermal head according to a second embodiment of the present invention which differs from that of the first embodiment only in one point.

Specifically, the thermal head of FIG. 4 incorporates an antistatic resinous package 14A which consists of an inner portion 18 entirely enclosing the drive IC's 5 and the wires 7, and a surface portion or layer 19 covering the inner portion 18. The inner portion 18 is made for example of thermosetting epoxy resin which is highly non-conductive electrically (electrostatically non-conductive as well), whereas the antistatic surface layer 19 is made of a resinous material similar to that of the first embodiment to become electrostatically conductive but electrically non-conductive. The thickness of the surface layer 19 may be relatively small or relatively large.

Because of the high insulating ability of the inner portion 18, the antistatic resinous package 14A of FIG. 4 is capable of more reliably preventing the drive IC's 5 from electrostatic disturbances (noises and/or operation failures) and damages even if the surface layer 19 is electrostatically charged to a greater extent than normally expected. Obviously, the resistor line 4 is also prevented from electrostatic damages similarly to the first embodiment. It should be appreciated that electrostatic charging occurs only at the surface of the resinous package 14A, so that it suffices to provide an antistatic layer only at the surface of the package.

Figure 5:
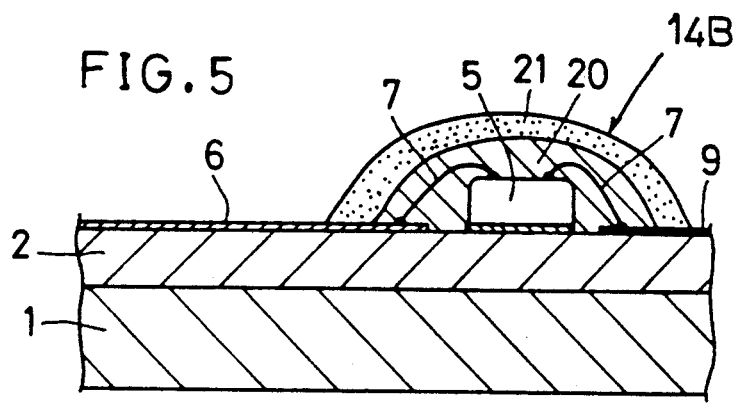
FIG. 5 is a sectional view similar to FIG. 4 but showing a thermal head according to a third embodiment of the present invention.

FIG. 5 represents an antistatic resinous package 14B according to a third embodiment of the present invention.

Similarly to the first embodiment, the package 14B of the second embodiment has a double structure which consists of an inner portion 20 entirely enclosing the drive IC's 5 and the wires 7, and a surface portion or layer 21 covering the inner portion 20. The inner portion 20 is made of relatively soft resin such as silicone resin which is electrostatically and electrically non-conductive, whereas the antistatic surface layer 21 is made of a resinous material similar to that of the first embodiment to become electrostatically conductive but electrically non-conductive. Preferably, the thickness of the antistatic surface layer 21 is rendered sufficiently large to prevent the inner portion 20 from being mechanically deformed by external forces.

Due to the soft nature of the inner portion 20, the antistatic resinous package 14B of the third embodiment allows thermal expansion and contraction of the drive IC's 5. Thus, the drive IC's are prevented from mechanically damaged by such expansion and contraction. Obviously, the antistatic surface layer 21 provides the same advantages as already described.

Figure 6:
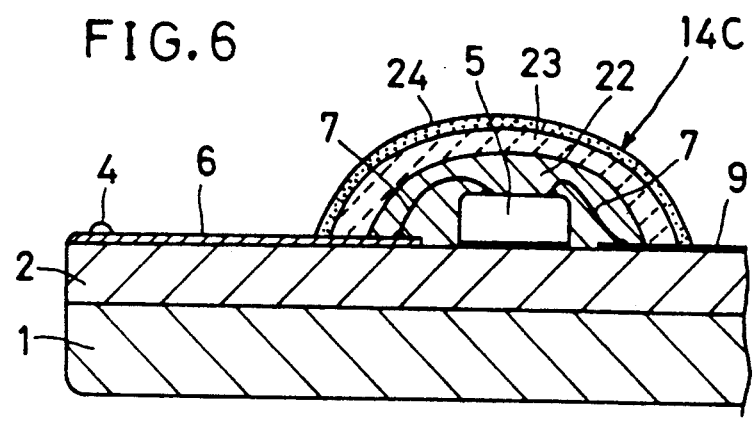
FIG. 6 is a sectional view also similar to FIG. 4 but showing a thermal head according to a fourth embodiment of the present invention.

According to a fourth embodiment shown in FIG. 6, an antistatic resinous package 14C has a triple structure. Specifically, the package 14C consists of an inner portion 22 entirely enclosing the drive IC's 5 and the wires 7, an intermediate portion or layer 23 enclosing the inner portion 22, and a surface portion or layer 24 covering the intermediate layer 23. The inner portion 22 is made of relatively soft resin such as silicone resin which is electrostatically and electrically non-conductive, whereas the intermediate layer 23 is made for example of thermosetting epoxy resin which is relatively hard and highly non-conductive electrically (electrostatically non-conductive as well). Further, the antistatic surface layer 21 is made of a resinous material similar to that of the first embodiment to become electrostatically conductive but electrically non-conductive.

Obviously, according to the fourth embodiment of FIG. 6, the thermal expansion and contraction of the drive IC's 5 are allowed by the soft inner portion 22, while the mechanical strength against external forces is provided by the hard intermediate layer 23. Further, the antistatic surface layer 24 prevents adverse influences which might be caused by electrostatic charging, as already described. Thus, the antistatic resinous package 14C of this embodiment is advantageous in various respects.

Figure 7:
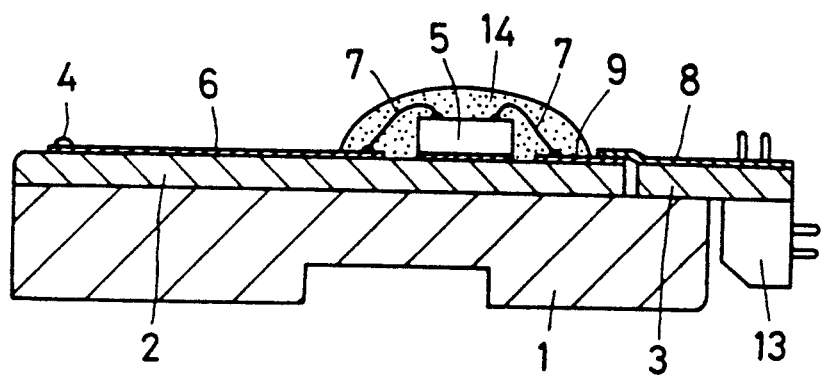
FIG. 7 is a sectional view similar to FIG. 3 but showing a thermal head according to a fifth embodiment of the present invention.

FIG. 7 shows a thermal head according to a fifth embodiment of the present invention which differs from the first embodiment only in that a flexible connector board 8 is electrically connected to the head circuit board 2 by soldering or by using an electrically conductive adhesive. Thus, in this embodiment, no presser member and no mounting means therefor are required, thereby simplifying the overall arrangement of the thermal head.

The invention being thus described, it is obvious that the same may be varied in many ways. Such variations are not to be regarded as a departure from the spirit and scope of the invention, and all such modifications as would be obvious to those skilled in the art are intended to be included within the scope of the following claims.

We claim:

1. A thermal head comprising a head circuit board having a surface carrying a means for generating heat by electrical resistance and at least one drive element for heating said means for generating heat by electrical resistance, said at least one drive element being enclosed in a resinous package, wherein
    at least a surface portion of the resinous package is electrostatically conductive but electrically non-conductive, with a volume resistivity of $10^5$–$10^{19}$ $\Omega$-cm, to work as antistat, wherein static electricity is allowed to escape along the at least a surface portion of the resinous package.

2. The thermal head according to claim 1, wherein the resinous package has an entirety, and wherein the entirety of the resinous package is electrostatically conductive but electrically non-conductive.

3. The thermal head according to claim 1, wherein the resinous package has an inner portion which is electrostatically and electrically non-conductive, the surface portion of the resinous package along being electrostatically conductive but electrically non-conductive.

4. The thermal head according to claim 3, wherein the inner portion of the resinous package is made of resin which is highly non-conductive electrically.

5. The thermal head according to claim 3, wherein the inner portion of the resinous package is made of a relatively soft resin.

6. The thermal head according to claim 1, wherein the resinous package has an inner portion which is made of a relatively soft resin, the resinous package further having an intermediate portion which is made of a relatively hard resin, the inner and intermediate portions being electrostatically and electrically non-conductive, the surface portion of the resinous package along being electrostatically conductive but electrically non-conductive.

7. The thermal head according to claim 1, wherein the at least a surface portion of the resinous package is made of matrix resin which contains a predetermined percentage of electrically conductive substance.

* * * * *